(12) United States Patent
Maruyama

(10) Patent No.: US 6,411,541 B2
(45) Date of Patent: Jun. 25, 2002

(54) METHOD FOR CONTROLLING RE-WRITING OPERATION FOR MEMORY CELL IN SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

(75) Inventor: Akira Maruyama, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/904,448

(22) Filed: Jul. 12, 2001

(30) Foreign Application Priority Data

Jul. 13, 2000 (JP) .......................... 2000-212654
Jun. 20, 2001 (JP) .......................... 2001-186698

(51) Int. Cl.$^7$ .............................. G11C 11/22; G11C 7/00
(52) U.S. Cl. .................. 365/145; 365/205; 365/222
(58) Field of Search ............................. 365/145, 149, 365/222, 205, 207, 208, 210

(56) References Cited

U.S. PATENT DOCUMENTS 4,873,664 A * 10/1989 Eaton, Jr. ................. 365/145
5,995,407 A * 11/1999 Kamp ...................... 365/145

* cited by examiner

*Primary Examiner*—Son Mai
(74) *Attorney, Agent, or Firm*—Harness, Dickey & Pierce, P.L.C.

(57) ABSTRACT

A semiconductor integrated circuit is provided wherein, when a sense amplifier 3 detects H data, the potential on a plate line PL switches from the power supply potential VDD to the GND potential. In other words, the timing at which the potential on the plate line is shifted from the power supply potential VDD to the GND potential is set immediately after the sense amplifier reads data. As a result, the start timing for a re-writing operation can be quickened.

13 Claims, 3 Drawing Sheets

PRIOR ART

METHOD FOR CONTROLLING RE-WRITING OPERATION FOR MEMORY CELL IN SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

BACKGROUND OF THE INVENTION

1. Technical Field of the Invention

The present invention relates to a method for controlling a re-writing operation for a memory cell in a semiconductor integrated circuit that is equipped with a memory cell including a capacitor as a charge storing capacitor and a switching element as a transfer gate, a semiconductor integrated circuit, a semiconductor device equipped with many of the semiconductor integrated circuits, and an electronic apparatus using the semiconductor device, and more particularly to a technology to control a plate line when a re-writing operation is conducted after a reading operation of the memory cell is conducted.

2. Conventional Technology

A conventional semiconductor integrated circuit structure equipped with capacitors having ferroelectric films and their operation are shown in a block diagram in FIG. 5 and in a timing chart shown in FIG. 6, respectively.

First, the circuit structure shown in FIG. 5 is described. As being well known, memory cells 1 and 2 arranged side by side include, as their components, capacitors 5 and 7 as charge storage capacitors formed from ferroelectric films, and Nch transistors 4 and 6 as transfer gates for switching the capacitors, respectively. Each of the memory cells 1 and 2 is connected through a bit line BL to a sense amplifier 3 for reading data.

Gates of the Nch transistors 4 and 6 of the memory cells are connected to corresponding independent word lines WL1 and WL2, respectively. The bit line BL is connected to one of the source/drain of each of Nch transistors 8 and 14, respectively. The other of the source/drain of each of the Nch transistors 8 and 14 is grounded, and gates thereof are connected to signal lines for providing a pre-charge signal PRC.

The sense amplifier 3 is formed from Pch transistors 9 and 10, and Nch transistors 11~13. One of so urce/drain of the Pch transistor 9 and one of source/drain of the Pch transistor 10 are connected to one another, and a gate of the Pch transistor 9 and the other of source/drain of the Pch transistor 10 are both connected to the bit line BL. A reference potential VREF from a reference potential generation circuit (not shown) is inputted in a gate of the Pch transistor 10, the other of source /drain of the Pch transistor 9, and one of source/drain of each of the Nch transistor 11 and 12. The other of source/drain of each of the Nch transistors 11 and 12 is connected to one of source/drain of the Nch transistor 13. The other of source/drain of the Nch transistor 13 is grounded, and its gate receives an input of a sense amplifier drive signal SA.

As described above, the bit line BL that passes the sense amplifier circuit 3 (node A) is connected to one of source/drain of the Nch transistor 14, and is also connected to an input terminal of an inverter circuit 15. An output terminal of the inverter circuit 15 is connected to input terminals of inverter circuits 16 and 17, and an output terminal of the inverter circuit 16 is connected to the input terminal of the inverter circuit 15. Information read from the memory cells 1 and 2 by the sense amplifier circuit 3 are outputted as data ("Data output" in the figure) from an output terminal of the inverter circuit 17.

It is noted that the block selection circuit (not shown) outputs a block signal to thereby select among the signal lines (WL1, WL2, PL) that are subject to being driven to select either the memory cell 1 or 2 that is subject to a reading operation or a writing operation.

Next, a writing operation is described. When writing in the memory cell 1, the pre-charge signal PRC is lowered from the power supply potential VDD to the GND potential, then the potential on the bit line BL is set to the GND potential, and the GND potential on the word line WL1 is set to the power supply potential VDD to thereby put the transistor 4 in an ON state. When input data is H data, a wiring circuit (not shown) sets the potential on the bit line BL to the power supply potential VDD, and the potential on the plate line PL to the GND potential, such that an electric field directed from the bit line to the plate line is applied to the ferroelectric capacitor 5. As a result, a charge (data) associated with a polarization corresponding to the strength of the electric field and its direction can be written in the ferroelectric capacitor 5. When the input data is L data, the potential on the bit line BL is set to the GND potential, and the potential on the plate line PL is set to the power supply potential VDD, such that an electric field directed from the plate line to the bit line is applied to the ferroelectric capacitor 5. As a result, a charge (data) associated with a polarization corresponding to the strength of the electric field and its direction can be written in the ferroelectric capacitor 5. Subsequently, the power supply potential VDD on the word line WL1 is set to the GND potential to put the transistor 4 in an OFF state to thereby retain the written data, and complete the writing operation.

On the other hand, for the memory cell 2, the word line WL 2 is retained at the GND potential to put the transistor 6 in an OFF state and a writing operation is not conducted.

Next, a reading operation is described with reference to FIG. 5 and FIG. 6. FIG. 6 is a timing chart of a reading operation. When the memory cell 1 is read, the pre-charge signal PRC is lowered from the power supply potential VDD to the GND potential, and the potential on the bit line BL is set to the OND potential, and then the GND potential on the word line WL1 is set to the power supply potential VDD to put the transistor 5 in an ON state. Next, the potential on the plate line PL is changed from the GND potential to the power supply potential VDD, with the result that a potential corresponding to a charge (data) associated with a polarization retained in the ferroelectric capacitor 4 is generated on the bit line BL. Here, the reference potential VREF of the sense amplifier 3 is set at a value intermediate of the bit line potentials that are to be generated respectively corresponding to H level and L level of data. When the sense amplifier drive signal SA is elevated from the GND potential to the power supply potential VDD, the sense amplifier 3 immediately detects and amplifies the magnitude of the potential, such that data corresponding to H level or L level of memory cell data is outputted. In other words, when the data is at H level, the bit line potential is greater than the reference potential VREF, such that the potential VA at the node A is at H level and H data is outputted. When the data is at L level, the bit line potential is smaller than the reference potential VREF, such that the potential VA at the node A remains to be at L level, and L data is outputted (this is referred to as a sense operation).

Here, when the data is H data, in association with the reading operation, an electric field directed from the plate line to the bit line is once applied to the ferroelectric capacitor 4. As a result, the data is destroyed (becomes L data). Therefore, while the sense amplifier drive signal SA is retained at the power supply potential VDD, and the potential on the bit line BL (that is equal to the potential VA at the node A in the figure) is retained at the power supply potential VDD, it needs to wait until time t2 to shift the potential on the plate line PL from the power supply potential VDD to the GND potential to apply to the capacitor 5 an electric field directed from the bit line to the plate line to thereby re-write data H. The reading operation is completed after the re-writing operation is completed.

In the conventional technology, to suppress variations in the bit line potential due to variations in the memory cells, the timing at which the potential on the plate line PL is shifted from the power supply potential VDD to the GND potential has to be delayed until time t2 shown in FIG. 6 well after the sense operation by the sense amplifier 3 is sufficiently performed.

Therefore, the start timing for a re-writing operation delays, and the completion of a reading operation delays, which, as a result, leads to a delay in the reading operation cycle.

The present invention solves the problem described above, and its object is to quicken a start of a re-writing operation to thereby quicken a completion of a reading operation, and to shorten the reading operation cycle.

SUMMARY OF THE INVENTION

In a method for controlling a re-writing operation for a memory cell in a semiconductor integrated circuit in accordance with the present invention, a method is provided for controlling a re-writing operation for a ferroelectric film in a semiconductor integrated circuit including a memory cell equipped with a ferroelectric film that stores data depending on a polarization state determined by a value of an applied voltage and a direction of the voltage, and a sense amplifier circuit that reads out data from the memory cell, wherein, when a re-writing operation is conducted after an operation to read data of the memory cell is conducted, a specified potential is applied to one end of the ferroelectric film based on a read data output of the sense amplifier circuit to thereby enable the re-writing operation.

Also, in a semiconductor integrated circuit in accordance with the present invention, the semiconductor integrated circuit enables a re-writing of the data in the ferroelectric film by the method for controlling a re-writing operation described above, wherein the semiconductor integrated circuit is equipped with a memory cell including a capacitor composing a ferroelectric film that stores data depending on a polarization state determined by a value of an applied voltage and a direction of the voltage, a sense amplifier circuit that reads out data from the memory cell, and a circuit that applies a specified potential to one end of the ferroelectric film based on a read data output of the sense amplifier circuit.

Furthermore, in a semiconductor integrated circuit in accordance with the present invention, the semiconductor integrated circuit comprises a memory cell including a capacitor composing a ferroelectric film that stores data depending on a polarization state determined by a value of an applied voltage and a direction of the voltage, and a sense amplifier circuit that reads out data from the memory cell, the semiconductor integrated circuit characterized in comprising a plate line ground potential application device that, upon receiving a read out data output from the sense amplifier circuit, applies a grounding potential to a cell plate that composes one electrode of the capacitor.

Still further, in a semiconductor device in accordance with the present invention, the semiconductor device is characterized in comprising a memory cell group including many of the memory cells arranged side by side, the bit line and the plate line, the word lines, and the sense amplifier circuit in the semiconductor integrated circuit described above, wherein a data output line is connected to the sense amplifier circuit for outputting the read data.

Also, an electronic apparatus in accordance with the present invention is equipped with the semiconductor device described above.

In accordance with the invention described above, the timing at which the potential on a plate line is shifted from a power supply potential (VDD) to a grounding potential (GND) can be set immediately after data is read by the sense amplifier. Accordingly, a start of a re-writing operation can be quickened, and a completion of a reading operation can be quickened, such that a reading operation cycle can be shortened.

EMBODIMENTS OF THE PRESENT INVENTION

Structures and operations of the conventional technology described above overlap those of an embodiment of the present invention. Therefore, features different from the conventional technology are mainly described.

First, an outline of a method for controlling a re-writing operation for a memory cell in accordance with one embodiment of the present invention is described. In a semiconductor integrated circuit in accordance with the present embodiment, when a sense amplifier circuit receives an output signal for data read from a memory cell, a cell plate of a capacitor of the memory cell is immediately and forcefully set to a GND potential (a grounding potential), to immediately enable the start of a re-writing operation.

Figure 1:
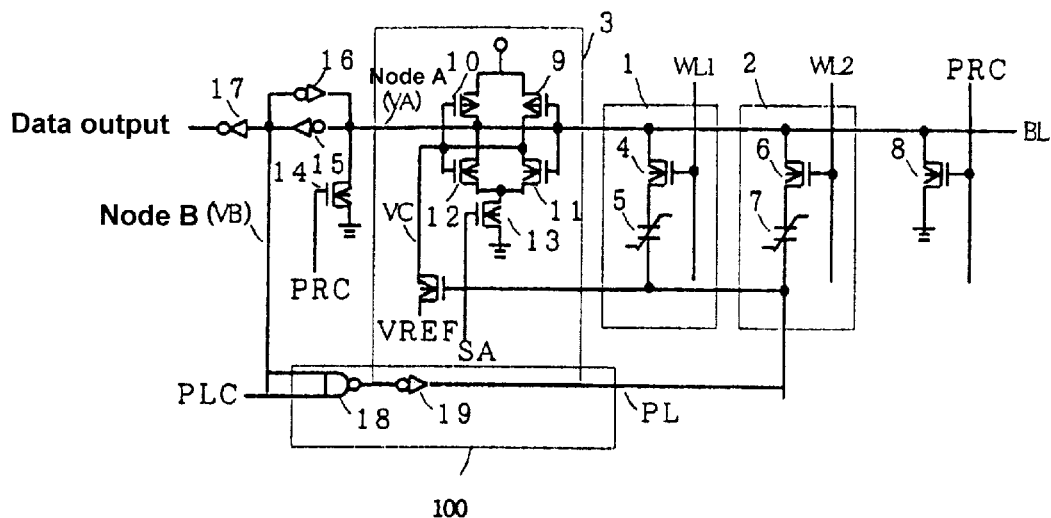
FIG. 1 shows a circuit diagram of a semiconductor integrated circuit in accordance with one embodiment of the present invention.
Figure 5:
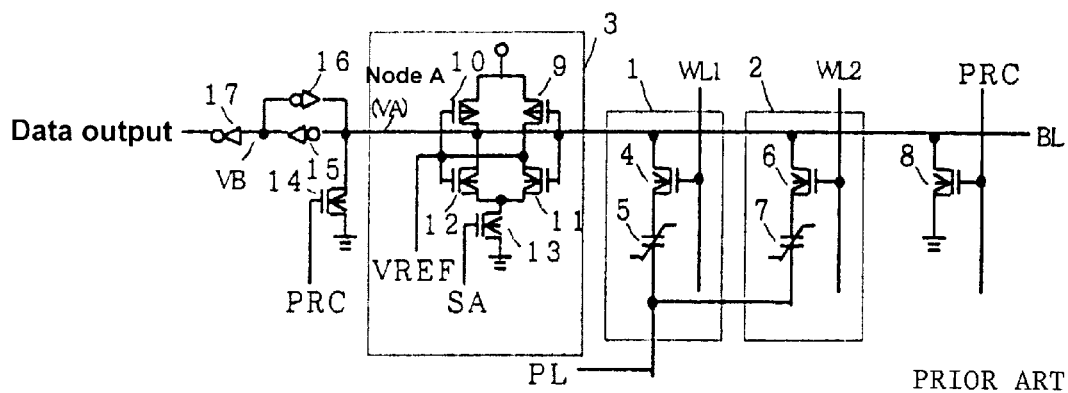
FIG. 5 shows a circuit diagram of a conventional semiconductor integrated circuit.

One example of a circuit structure that realizes the control method is described. In contrast to the conventional circuit shown in FIG. 5, first, a logical circuit 100 is provided, as shown in FIG. 1. The logical circuit 100 is formed from an NAND circuit 18 and an inverter circuit 19. One of input terminals of the NAND circuit 18 is connected to an output terminal of the inverter circuit 15 through a node B, and the other of the input terminals of the NAND circuit 18 receives an input of a plate line control signal PLC. An output terminal of the NAND circuit 18 is connected to an input terminal of the inverter circuit 19, and an output terminal of the inverter circuit 19 is connected to a plate line PL. Also, a Nch transistor is provided in the sense amplifier 3 as a switching element for supplying the reference voltage VREF, and a gate thereof is connected to the plate line PL. It is noted that the present embodiment is described, for simplicity, with only two word lines and one bit line.

Figure 2:
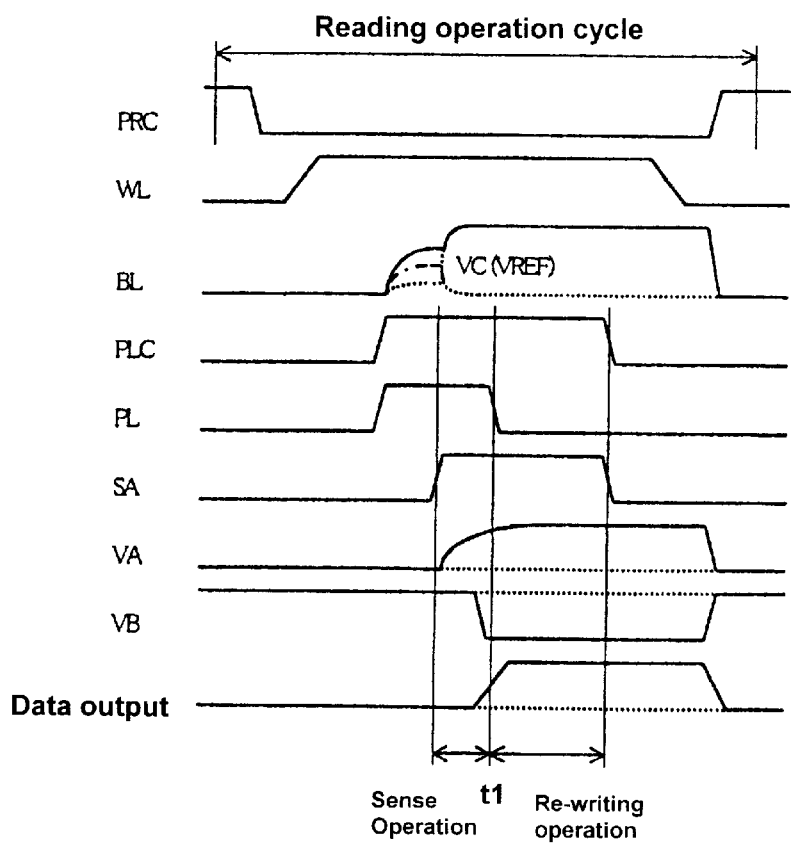
FIG. 2 shows a timing chart in accordance with one embodiment of the present invention.

Next, a reading operation is described with reference to FIGS. 1 and 2. FIG. 2 is a timing chart of the reading operation. When the memory cell 1 is read, the pre-charge signal PRC is lowered from the power supply potential VDD to the GND potential, and the potential on the bit line BL is set to the GND potential, and then the GND potential on the word line WL1 is set to the power supply potential VDD to put the transistor 4 in an ON state.

Next, the plate line control signal PLC is changed from the GND potential to the power supply potential VDD to shift the potential on the plate line PL from the GND potential to the power supply potential VDD, with the result that a potential corresponding to a charge (data) associated with a polarization retained in the ferroelectric capacitor 5 is generated on the bit line BL. Here, the reference potential VREF of the sense amplifier 3 is set at a value intermediate of the bit line potentials that are to be generated respectively corresponding to H level and L level of data. When the sense amplifier drive signal SA is elevated from the GND potential to the power supply potential VDD, the sense amplifier 13 immediately detects and amplifies the magnitude of the potential, such that data corresponding to H level or L level of memory cell data is outputted. In other words, when the data is at H level, the bit line potential is greater than the reference potential VREF, such that the potential VA at the node A is at H level and H data is outputted. When the data is at L level, the bit line potential is smaller than the reference potential VREF, such that the potential VA at the node A is at L level, and L data is outputted.

Figure 6:
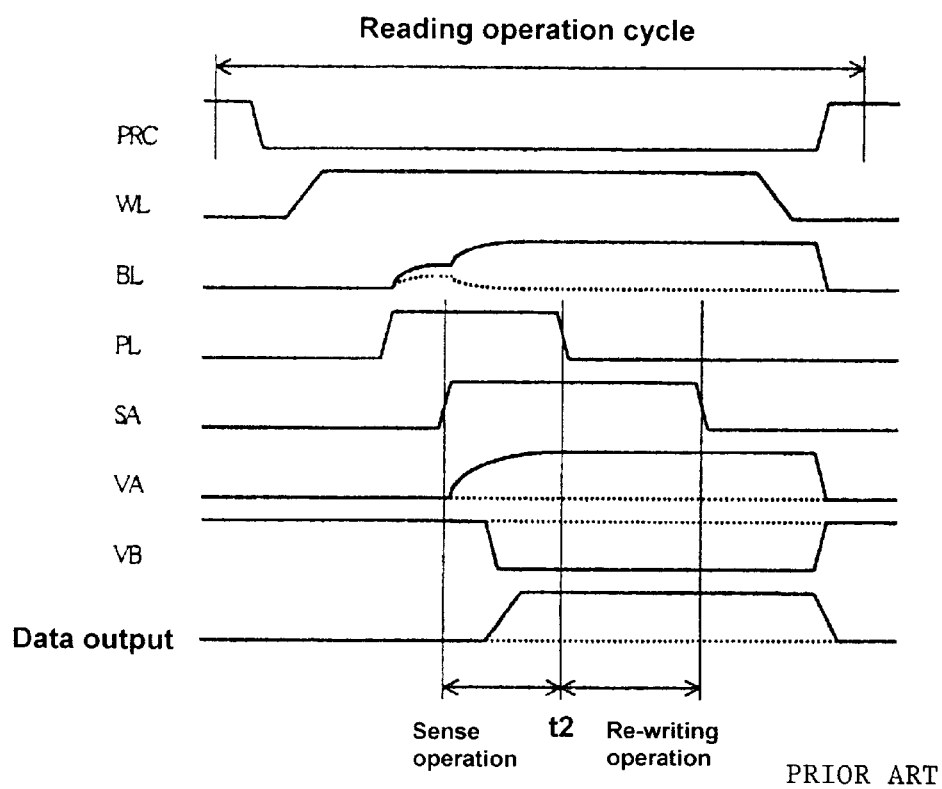
FIG. 6 shows a timing chart of the conventional example.

Here, when the data stored in the memory cells 1 and 2 is in a state of H level, the potential VA at the node A becomes H level, and the potential VB at the node B immediately shifts at time t1 from the power supply potential VDD to the GND potential. At this moment, since the plate line control signal PLC is at the power supply potential VDD, the NAND circuit 18 outputs "1", in other words, "H", which is inputted in the inverter circuit 19. The inverter circuit 19 provides an output signal that sets the potential VPL on the plate line PL at the GND potential, such that a re-writing operation can be immediately started. Since the potential on the bit line BL is retained at the power supply potential VDD, a re-writing operation is performed. The re-writing operation starts at time t1, which is earlier than time t2 in the conventional art shown in FIG. 6. Subsequently, the re-writing operation is completed and then the reading operation is completed.

It is noted that the writing operation i s the same as that of the conventional example, and therefore its description is omitted.

The writing operation and the reading operation are similarly performed for the memory cell 2.

Here, many of the semiconductor integrated circuits containing memory cells in accordance with the present invention may be placed side by side with a data writing circuit being added and a decoder for the word lines and the bit lines is used in a well known manner to thereby form a semiconductor device such as an FeRAM (Ferroelectric Random-access Memory).

Figure 4:
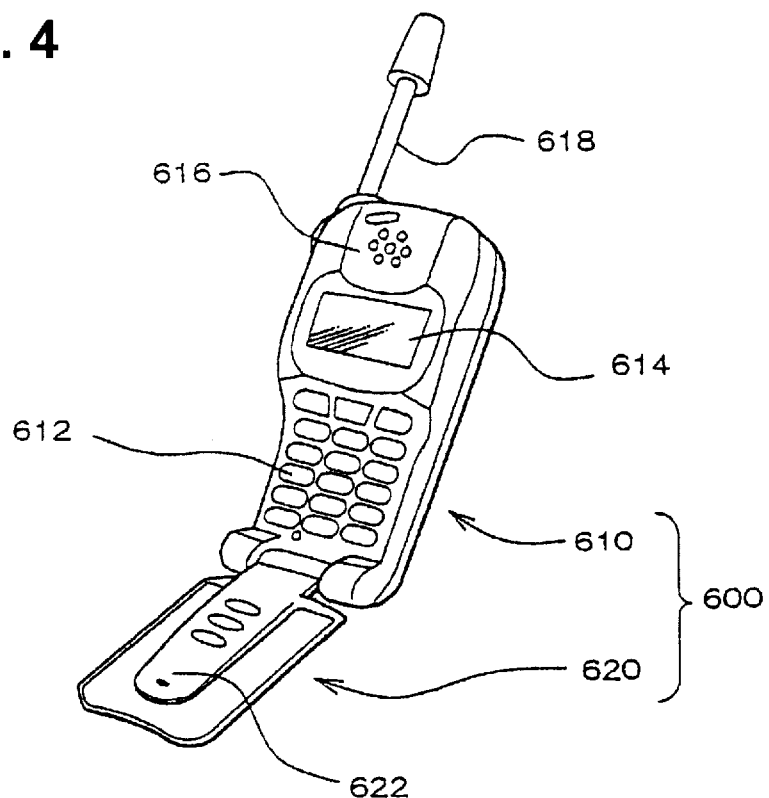
FIG. 4 shows a perspective view of a hand-carry type telephone that is equipped with the system shown in FIG. 3.
Figure 3:
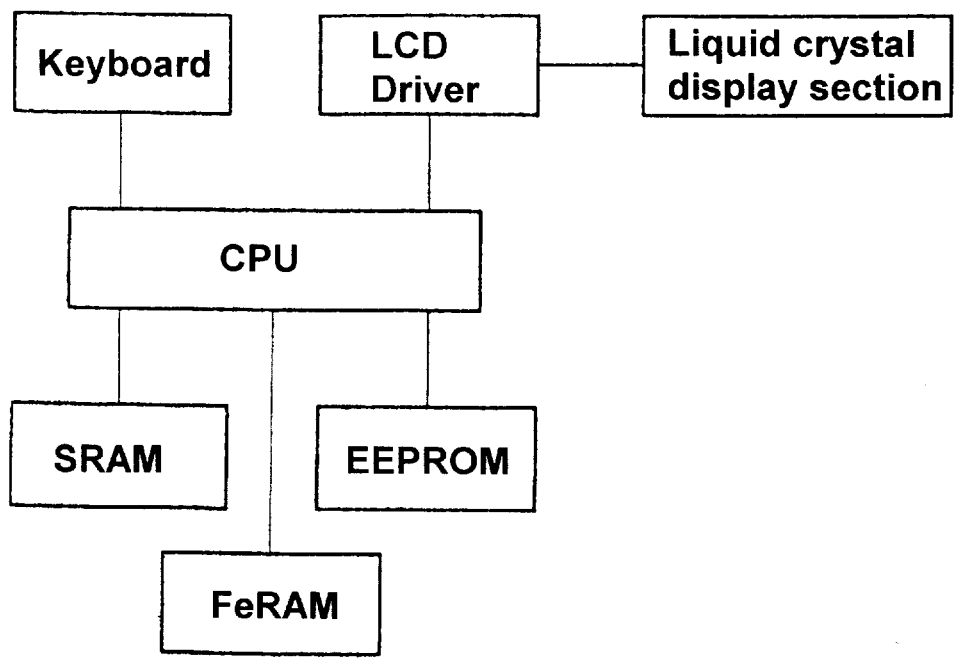
FIG. 3 shows a block diagram of a part of a hand-carry type telephone system as one example of an electronic apparatus in accordance with the present invention.

The semiconductor device thus formed can be applied to, for example, hand-carry type data terminals and telephones. FIG. 3 shows a part of an example of a system structure of an internal circuit thereof. As shown in FIG. 3, in addition to a FeRAM that is a semiconductor device in accordance with the present invention, an SRAM, an EEPROM, a keyboard and a LCD driver are connected through a bus line to a CPU. FIG. 4 shows a perspective view of a hand-carry type telephone that is equipped with the system. The hand-carry type telephone 600 shown in FIG. 4 is formed from a main body portion 610 and a lid portion 620. The main body portion 610 is equipped with well-known elements that perform linked actions, such as a keyboard 612, a liquid crystal display section 614, a receiver section 616, and an antenna section 618. The lid portion 620 is equipped with a well-known transmission section 622 that performs actions linked with the main body section.

It is noted that, in the embodiment described above, appropriate modifications and design changes that provide similar effects can be made within a range that does not depart from the subject matter of the present invention. For example, a logical circuit of the semiconductor integrated circuit in accordance with the embodiment described above is not limited to the logical circuit 100 shown in FIG. 1, and a variety of logical gates and circuit elements can be used to compose a logical circuit that has similar input and output responses. Also, a data output from the sense amplifier 3 to be inputted in the logical circuit is not limited to an output from the inverter shown in FIG. 1, but can be an output from the inverter 17. In this manner, appropriate modifications can be made.

According to the above, the timing at which the potential on a plate line is shifted from a power supply potential VDD to a GND potential can be set immediately after data is read by a sense amplifier. Accordingly, a start of a re-writing operation can be quickened, and a completion of a reading operation can be quickened, such that a reading operation cycle can be shortened.

Also, since the potential on a plate line is shifted from a power supply potential VDD to a GND potential after the sense amplifier detects data, a sense operation and a re-writing operation can be securely performed against variations in the potential on the bit line associated with deviations in the cells.

Also, since the sense operation can be completed in a shortened time, an application of an electric field directed from a plate line to a bit line on the side of data H can be completed in a shorter time. Accordingly, the re-writing time can be shortened, and it is effective to improve the cycle number of repeated reading operations of a memory cell.

What is claimed is:

1. A method for controlling a re-writing operation for a ferroelectric film in a semiconductor integrated circuit including a memory cell equipped with a ferroelectric film that stores data depending on a polarization state determined by a value of an applied voltage and a direction of the voltage, and a sense amplifier circuit that reads out data from the memory cell, the method for controlling a re-writing operation for a memory cell in a semiconductor integrated circuit characterized in that;

when a re-writing operation is conducted after an operation to read data of the memory cell is conducted, a specified potential is applied to one end of the ferroelectric film based on a read data output of the sense amplifier circuit to thereby enable the re-writing operation.

2. A semiconductor integrated circuit that enables a re-writing of the data in the ferroelectric film by the method for controlling a re-writing operation according to claim 1, the semiconductor integrated circuit characterized in comprising:

a memory cell including a capacitor composing a ferroelectric film that stores data depending on a polarization state determined by a value of an applied voltage and a direction of the voltage;

a sense amplifier circuit that reads out data from the memory cell; and a circuit that applies a specified potential to one end of the ferroelectric film based on a read data output of the sense amplifier circuit.

3. A semiconductor integrated circuit comprising;

a memory cell including a capacitor composing a ferroelectric body that stores data depending on a polarization state determined by an applied voltage and a direction of the voltage; and a sense amplifier circuit that reads out data from the memory cell;

a logic circuit that, upon receiving a read out data output from the sense amplifier circuit, applies a grounding potential to a cell plate that composes one electrode of the capacitor.

4. A semiconductor integrated circuit according to claim 3 characterized in that the cell plate of the capacitor is connected to a plate line that is capable of transferring a selected potential, and the plate line ground potential application device is equipped with a logical circuit that generates and supplies the grounding potential to the plate line based on the read data output of the sense amplifier circuit and a control signal for applying the grounding potential to the cell plate.

5. A semiconductor integrated circuit according to claim 4, characterized in that the memory cell is equipped with an n-type transistor for switching for making the capacitor charge and discharge a charge, the plate line is connected to the cell plate that is one of the electrodes of the capacitor, and one of a source/drain of the n-type transistor is connected to the other of the electrodes, a bit line is connected to the other of the source/drain of the n-type transistor, and the bit line is connected to the sense amplifier circuit, the sense amplifier circuit outputs the read data based on a potential obtained from the bit line, and the n-type transistor is a semiconductor integrated circuit that is driven on and off by a voltage applied through a memory cell selection word line that is connected to a gate thereof.

6. A semiconductor integrated circuit according to claim 2 characterized in that the read data of the sense amplifier circuit is a data signal 1 (H level).

7. A semiconductor device characterized in comprising a memory cell group including many memory cells arranged side by side, the bit line and the plate line, the word lines, and the sense amplifier circuit in the semiconductor integrated circuit according to claim 2, wherein a data output line is connected to the sense amplifier circuit for outputting the read data.

8. A semiconductor device according to claim 7 characterized in that the semiconductor device functions as a FeRAM.

9. An electronic apparatus characterized in comprising the semiconductor device according to claim 8.

10. A semiconductor integrated circuit according to claim 3 characterized in that the read data of the sense amplifier circuit is a data signal 1 (H level).

11. A semiconductor device characterized in comprising a memory cell group including many memory cells arranged side by side, the bit line and the plate line, the word lines, and the sense amplifier circuit in the semiconductor integrated circuit according to claim 3, wherein a data output line is connected to the sense amplifier circuit for outputting the read data.

12. A semiconductor device according to claim 11 characterized in that the semiconductor device functions as a FeRAM.

13. An electronic apparatus characterized in comprising the semiconductor device according to claim 12.

* * * * *

UNITED STATES PATENT AND TRADEMARK OFFICE
CERTIFICATE OF CORRECTION

PATENT NO. : 6,411,541 B2
DATED : June 25, 2002
INVENTOR(S) : Maruyama

It is certified that error appears in the above-identified patent and that said Letters Patent is hereby corrected as shown below:

Column 1,
Line 49, "so urce/drain" should be -- source/drain --.

Column 2,
Line 45, "OND" should be -- GND --.

Column 6,
Line 59, "that;" should be -- that: --.

Column 7,
Line 14, "comprising;" should be -- comprising --.

Signed and Sealed this

Eleventh Day of February, 2003

JAMES E. ROGAN
*Director of the United States Patent and Trademark Office*